United States Patent
Tsai et al.

(10) Patent No.: US 10,499,488 B1
(45) Date of Patent: Dec. 3, 2019

(54) LIQUID-COOLED INTEGRATED CIRCUIT SYSTEM

(71) Applicant: Hewlett Packard Enterprise Development LP, Houston, TX (US)

(72) Inventors: Pinche Tsai, Houston, TX (US); Minh H. Nguyen, Houston, TX (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 0 days.

(21) Appl. No.: 16/165,960

(22) Filed: Oct. 19, 2018

(51) Int. Cl.
| | |
|---|---|
| H05K 7/20 | (2006.01) |
| H05K 1/02 | (2006.01) |
| H01L 23/42 | (2006.01) |
| H01L 23/367 | (2006.01) |
| H05K 1/18 | (2006.01) |
| H05K 1/14 | (2006.01) |
| H05K 3/30 | (2006.01) |
| H01R 12/73 | (2011.01) |

(52) U.S. Cl.
CPC ......... *H05K 1/0203* (2013.01); *H01L 23/367* (2013.01); *H01L 23/42* (2013.01); *H05K 1/144* (2013.01); *H05K 1/181* (2013.01); *H05K 3/303* (2013.01); *H01R 12/737* (2013.01); *H05K 2201/042* (2013.01); *H05K 2201/064* (2013.01); *H05K 2201/066* (2013.01); *H05K 2201/10159* (2013.01); *H05K 2201/10325* (2013.01)

(58) Field of Classification Search
CPC ....... H01L 2924/00; H01L 2224/16225; H01L 2924/0002; H01L 23/473; H01L 2224/32245; H01L 23/3672; H01L 23/427; H01L 23/367; H01L 23/4093; H01L 2023/405; H05K 2201/1056; H05K 2201/10159; H05K 3/0061; H05K 1/141; H05K 1/0203; H05K 2201/066; H05K 7/20509; H05K 1/181; H05K 2201/10378; H05K 2201/10598; H05K 7/20154; H05K 7/2049; G06F 1/20; G06F 1/16; G06F 1/184; G06F 2200/201; H01R 12/62; H01R 12/52; H01R 12/737; H01R 12/79
USPC .... 257/713, E23.08, 706, E23.098; 361/720, 361/679.31, 719, 679.54, 699, 704, 702, 361/760; 165/80.2; 438/122
See application file for complete search history.

(56) References Cited

U.S. PATENT DOCUMENTS

| | | |
|---|---|---|
| 8,659,897 B2 | 2/2014 | Meijer et al. |
| 9,577,227 B2 | 2/2017 | Sumpf et al. |
| 9,761,919 B2 | 9/2017 | Lane et al. |
| 2008/0123297 A1 | 5/2008 | Tilton et al. |

(Continued)

OTHER PUBLICATIONS

Niall T. Davidson, "Improved Fanless Rail Cooled Electronic Apparatus," 2018, pp. 1-18, ADC Technologies Inc.

*Primary Examiner* — Mandeep S Buttar
(74) *Attorney, Agent, or Firm* — Sheppard Mullin Richter & Hampton

(57) ABSTRACT

A liquid-cooled integrated circuit system includes two printed circuit assemblies having removable heat spreaders and cooling pipes coated with a thermal interface material. The two printed circuit assemblies are placed together in opposition such that the top surfaces of the heat spreaders on each printed circuit assembly contacts, and become thermally coupled with, the thermal interface material on the cooling pipes of the other printed circuit assembly. In this arrangement, each printed circuit assembly is cooled by the other.

20 Claims, 10 Drawing Sheets

(56) References Cited

U.S. PATENT DOCUMENTS

2012/0020022 A1\* 1/2012 Peterson et al. ......... H05K 7/20
                                                    361/699
2013/0120926 A1\* 5/2013 Barina et al. ............. G06F 1/20
                                                    361/679.32

\* cited by examiner

LIQUID-COOLED INTEGRATED CIRCUIT SYSTEM

BACKGROUND

Modern computer systems generate large quantities of heat. While some of this heat is generated by power supplies and the like, the majority of the heat is generated by integrated circuits such as processors and memory chips. In order to function properly, these computer systems must be kept within a certain temperature range. Therefore, the heat generated by these processors and memory chips must be dissipated or otherwise removed.

BRIEF DESCRIPTION OF THE DRAWINGS

The present disclosure, in accordance with one or more various embodiments, is described in detail with reference to the following figures. The figures are provided for purposes of illustration only and merely depict typical or example embodiments.

The figures are not exhaustive and do not limit the present disclosure to the precise form disclosed.

DETAILED DESCRIPTION

Integrated circuits such as Dual Inline Memory Modules (DIMMs) generate a lot of heat, especially in high-density configurations. Many techniques exist to cool them, but there are disadvantages associated with these existing techniques. Air cooling is noisy, and therefore undesirable when deployed near office workers/in a working environment. Liquid immersion cooling is messy when maintenance of the DIMMs is required. Another approach uses DIMM packages that encapsulate the DIMMs in a heat spreader that is thermally coupled to a cooling pipe that circulates a chilled liquid.

The disclosed embodiments pair two system boards, each having cooling pipes, interleaved between DIMM modules. When the boards are brought together in opposition, the DIMM modules on each system board are cooled by the cooling pipes on the other system board. This approach allows greater densities of DIMMs than previous approaches while still providing the necessary cooling. This approach is also quiet, and so can be located near office personnel. This approach also allows easy maintenance, without the spills associated with liquid immersion cooling systems. While various embodiments are described with reference to DIMMs, it should be appreciated that the disclosed technology can be used to cool any integrated circuit or similar system(s) and element(s)/components therein.

Figure 1:
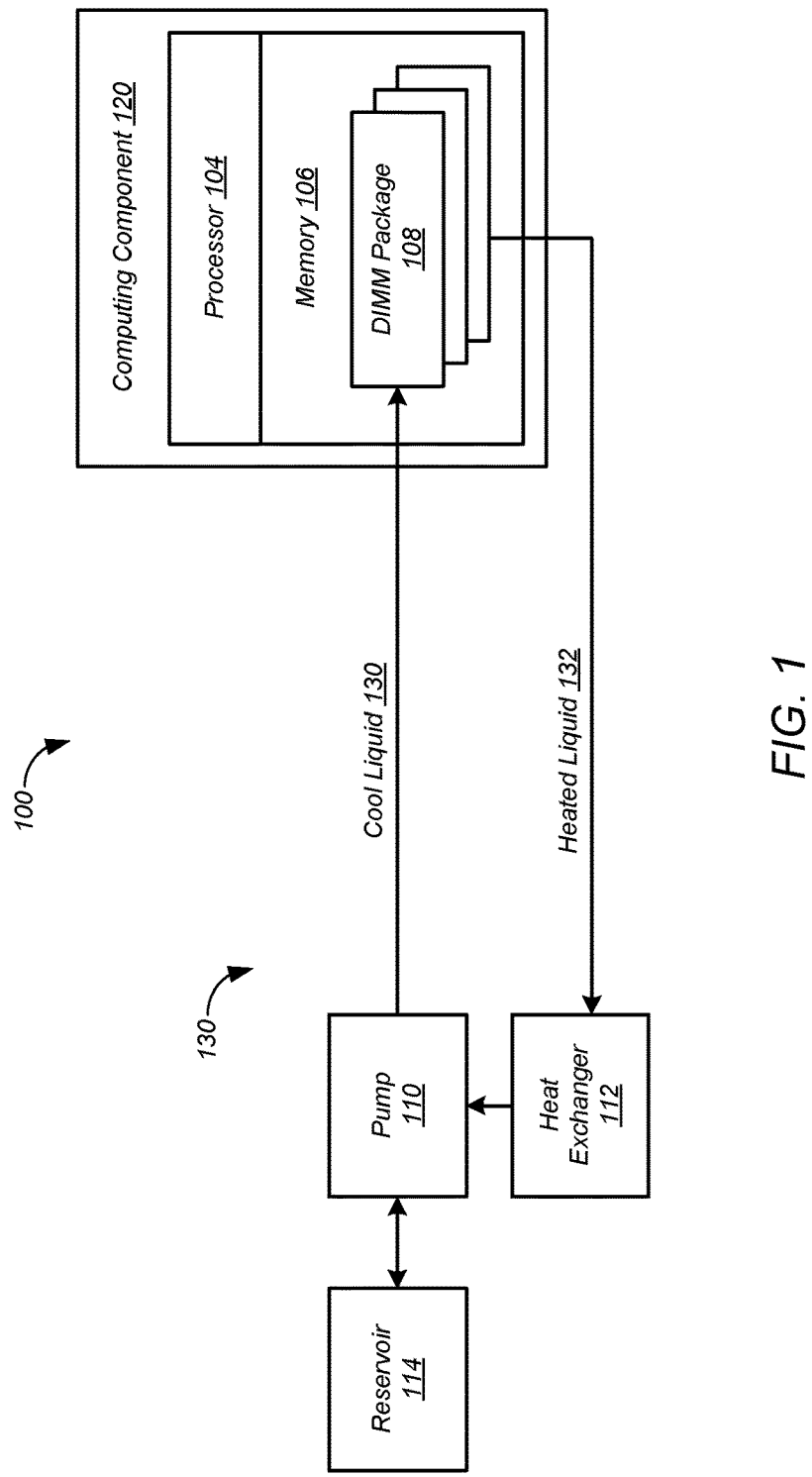
FIG. 1 is a context diagram of a system in which various embodiments may be implemented.

FIG. 1 is a context diagram of a system 100 in which various embodiments may be implemented. System 100 includes a computing component 120 that includes a processor 104 and a memory 106. The memory 106 includes a number of DIMM packages 108. System 100 also includes a cooling loop 130. The cooling loop 130 includes a pump 110, a heat exchanger 112, and a reservoir 114. The pump 110 provides cool liquid 130 to the DIMM packages 108. The heat generated by the DIMM packages 108 is passed to the liquid heating it and cooling the DIMM packages 108. The pump 110 removes the heated liquid 132 from the DIMM packages 108. The heat exchanger 112 cools the heated liquid 132. The reservoir 114 accommodates changes in the volume of the liquid.

Figure 2B:
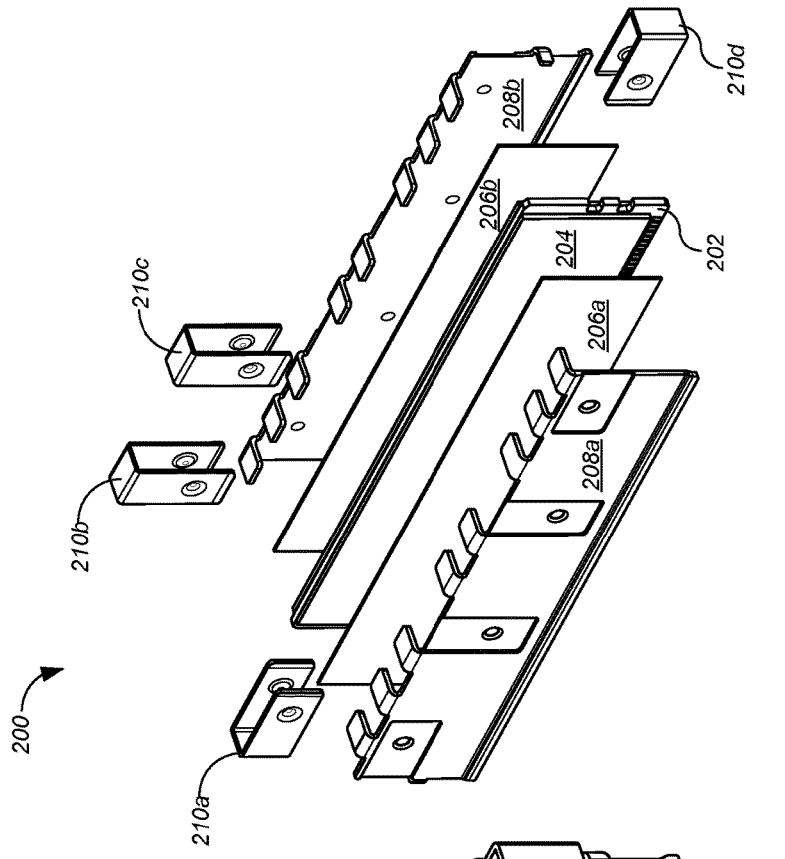
FIGS. 2A and 2B show a DIMM package according to one embodiment.
Figure 2A:
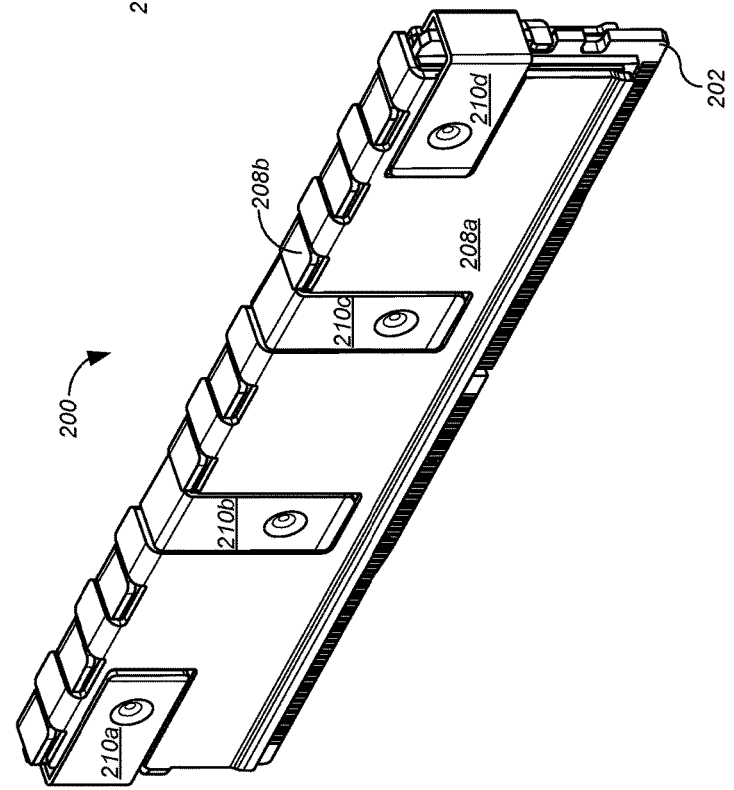

FIGS. 2A and 2B show a DIMM package 200 according to one embodiment. FIG. 2A is a perspective view of the DIM package 200 in its assembled state. An exploded view of DIMM package 200 is shown in FIG. 2B. The DIMM package 200 includes a printed circuit board 202 on which one or more integrated circuits, shown generally at 204, are mounted. The printed circuit hoard 202 is generally double-sided, with integrated circuits 204 mounted upon both sides.

Layers of thermal interface material 206a,b are thermally coupled to the integrated circuits 204. One common thermal interface material is a thermal gap pad. However, other thermal interface materials may be used, for example such as thermal grease and the like.

In the depicted embodiment, a removable heat spreader having a pair of side plates 208a,b is brought into physical contact with the layers of thermal interface material 206a,b, and is thereby thermally coupled to the thermal interlace material 206 a,b. The side plates 208 a,b may be made of aluminum. However, other materials may be used to form the side plates 208 a,b, for example such as stainless steel, or the like. The side plates 208 a,b may be identical in order to reduce manufacturing costs.

One or more removable spring clips 210a,b,c,d may be positioned about the side plates 208 a,b to press them against the thermal interface material 206 a,b to ensure proper thermal coupling.

Figure 3:
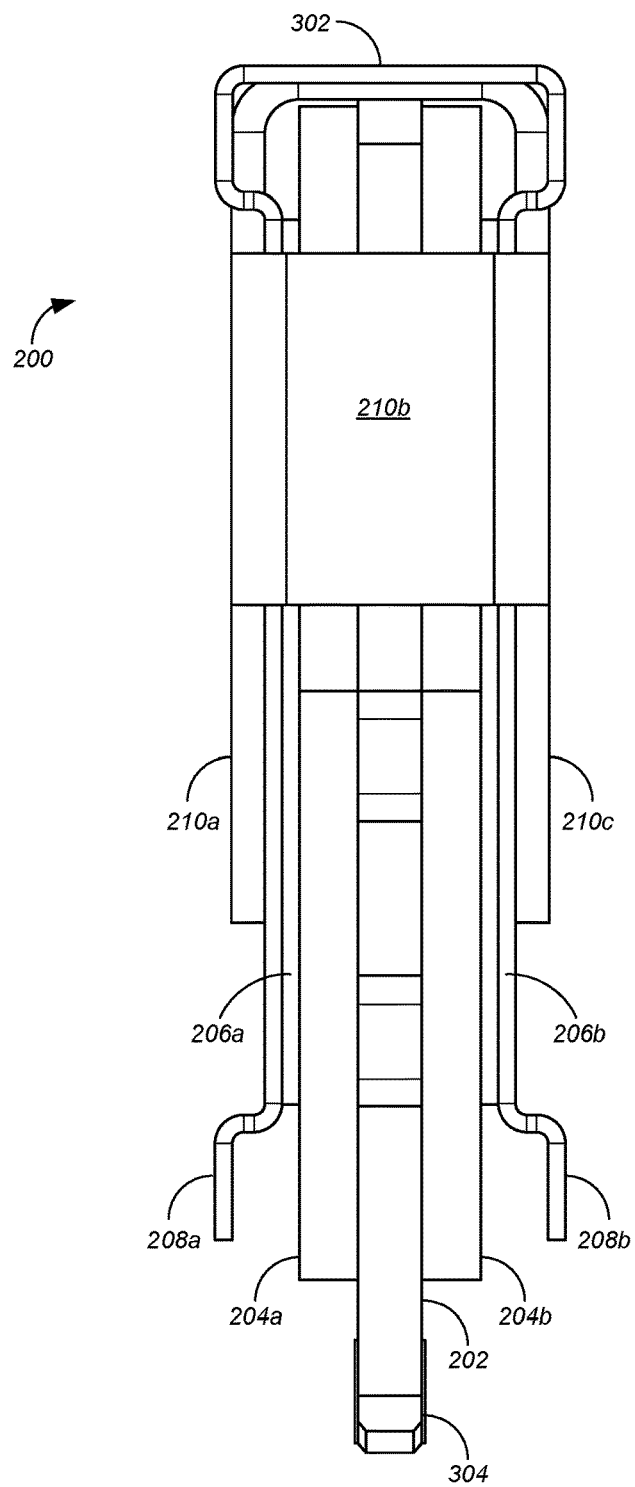
FIG. 3 shows a view of an edge of the DIMM package of FIG. 2.

FIG. 3 shows a view of an edge of the DIMM package 200 of FIG. 2. FIG. 3 shows the printed circuit board 202, the integrated circuits 204a,b, the layers of thermal interface material 206a,b, the heat spreader plates 208a,b, and the spring clips 210a,b,c. Features of particular interest for the disclosed technology include the upper surface 302 of the heat spreader plates 208 formed by one or more of the side plates 208 extending across the edge of the printed circuit board 202 opposite the connector edge 304. These features are discussed in more detail below.

Figure 4A:
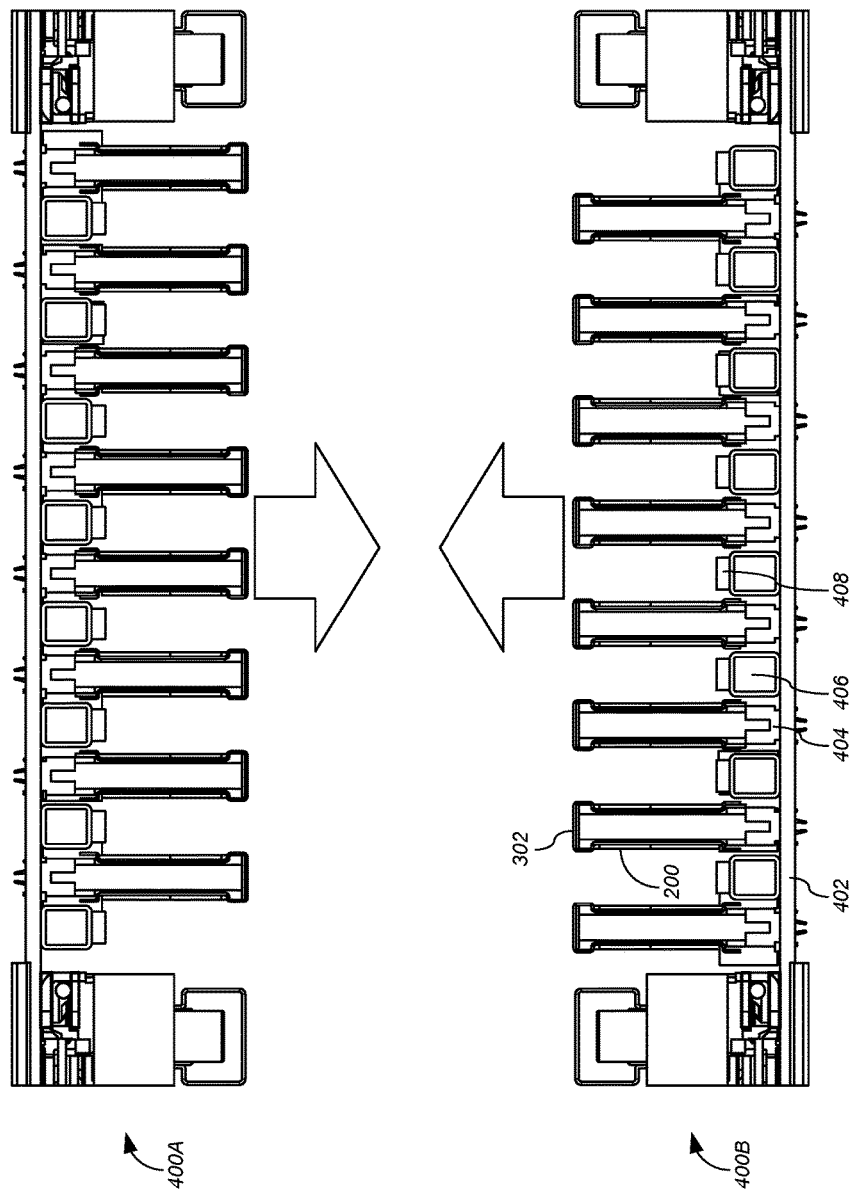
FIG. 4A shows two identical printed circuit assemblies according to one embodiment.

FIG. 4A shows two identical printed circuit assemblies 400A and 4006 according to one embodiment. Each of printed circuit assemblies 400A and 400B includes a system board 402, upon which a plurality of printed circuit board sockets, one of which is referenced as 404, are mounted in parallel. A cooling pipe 406 is mounted adjacent to, and parallel to each printed circuit board socket 404. A layer of thermal interface material 408 is disposed upon, and thermally coupled to, each cooling pipe 406 on the side of the cooling pipe opposite the system board 402. A plurality of DIMM packages, one of which is referenced as 200, are electrically coupled to the system board 402. In particular, the connector edge 304 of each DIMM package 200 is disposed in one of the printed circuit board sockets 404.

Figure 4B:
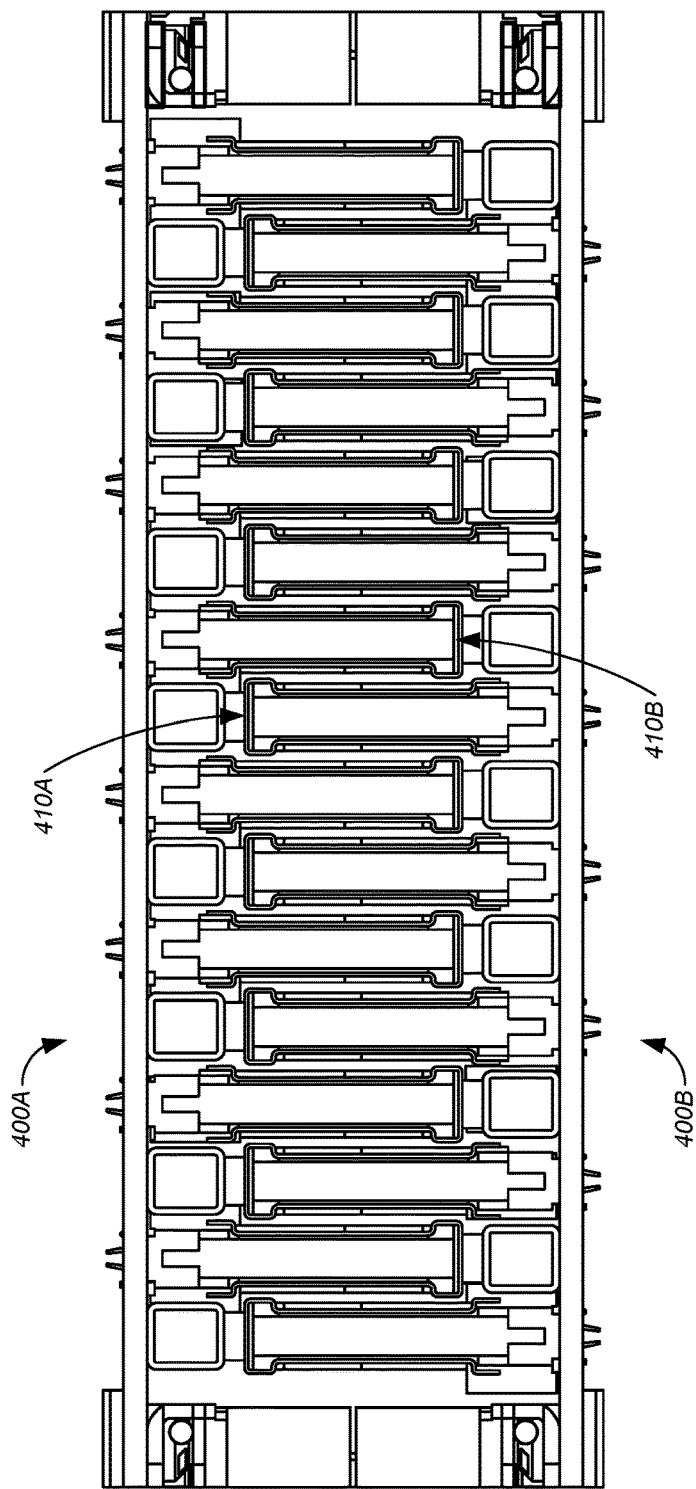
FIG. 4B shows the two printed circuit assemblies of FIG. 4A brought together in opposition such that the top surfaces of the heat spreaders on each of the printed circuit assemblies contact, and become thermally coupled with, the thermal interface material layers on the other printed circuit assembly.

When the two printed circuit assemblies 400A and 400B are brought together in opposition, as shown in FIG. 4B, the top surfaces 302 of the heat spreaders 208*a,b* on each of the printed circuit assemblies 400 contact, and become thermally coupled with, the thermal interface material layers 408 on the other printed circuit assembly 400, as indicated at 410A and 410B. In this configuration, the DIMM packages 200 on each printed circuit assembly 400 are cooled by the cooling pipes 406 of the other printed circuit assembly 400.

Figure 5:
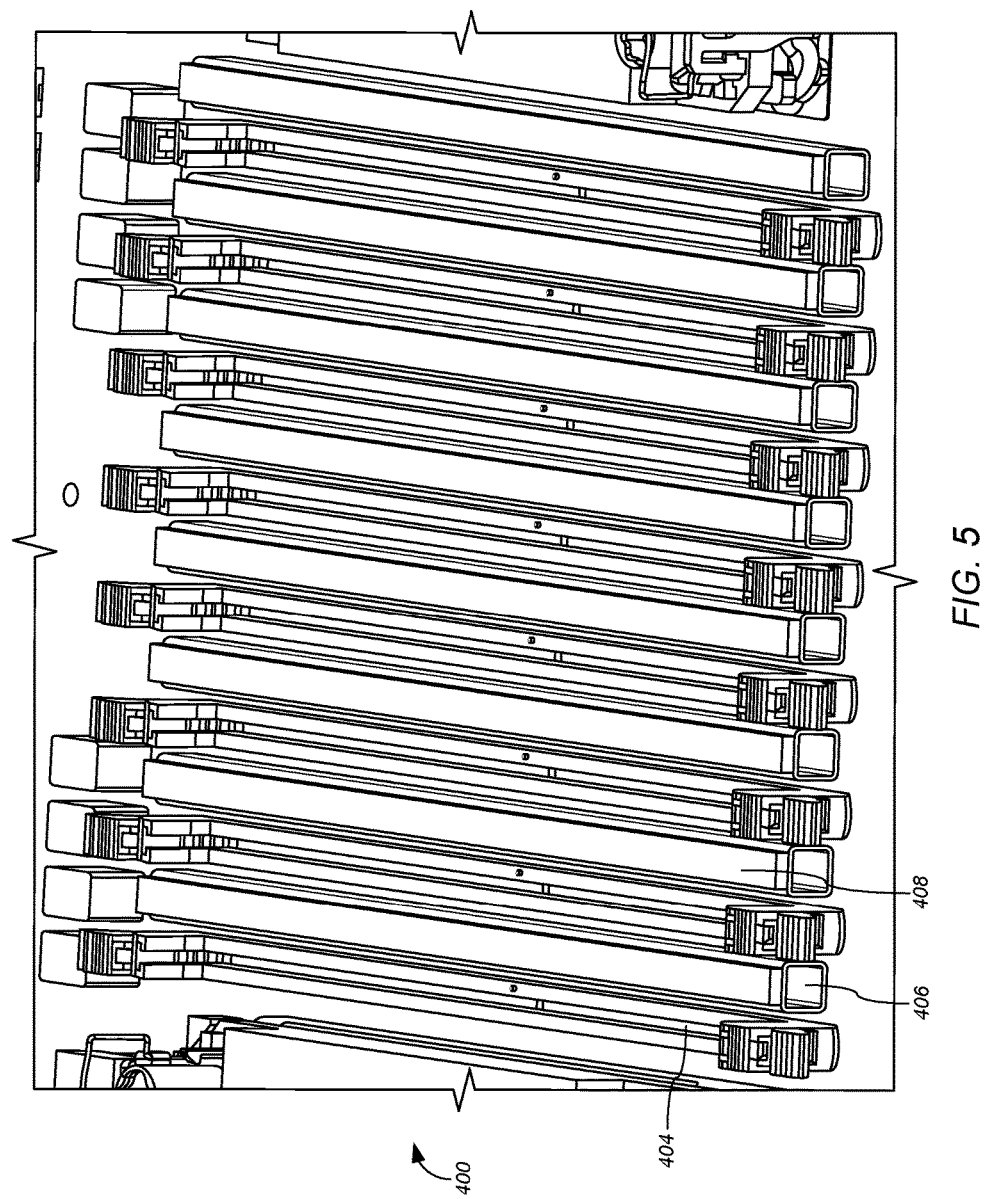
FIG. 5 is a perspective view of a printed circuit assembly with the DIMM packages removed.

FIG. 5 is a perspective view of a printed circuit assembly 400 with the DIMM packages 200 removed. Referring to FIG. 5, the printed circuit board sockets 404, the adjacent and parallel cooling pipes 406, and the layers of thermal interface material 408 disposed upon the parallel cooling pipes 406 may be seen clearly.

Figure 6:
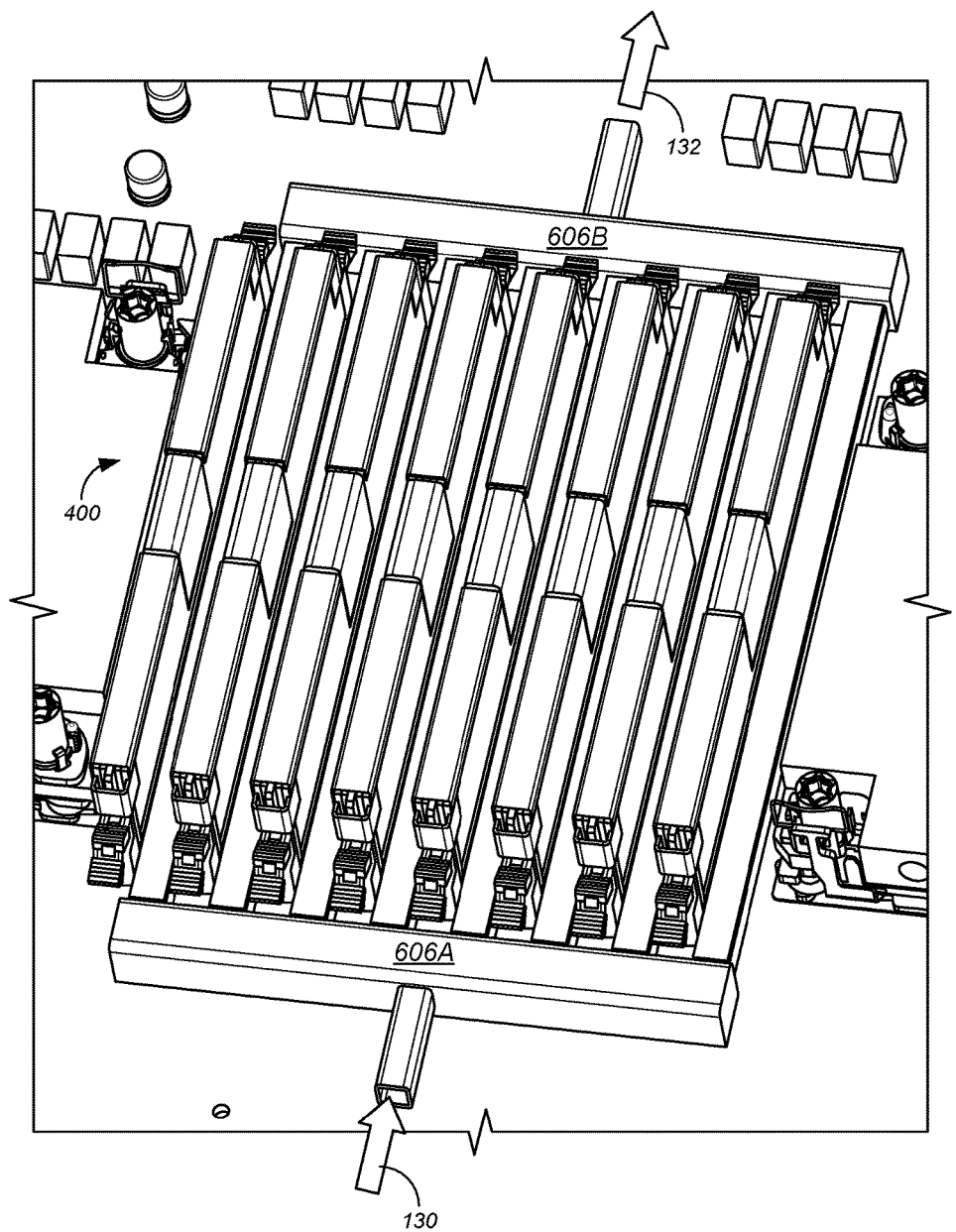
FIG. 6 is a perspective view of a printed circuit assembly with the DIMM packages 200 installed in the printed circuit board sockets, and with manifolds attached.

FIG. 6 is a perspective view of a printed circuit assembly 400 with the DIMM packages 200 installed in the printed circuit board sockets 404, and with manifolds attached. Referring back to FIG. 5, a first end of each cooling pipe 406 is coupled to an input manifold 606A, and a second end of each cooling pipe 406 is coupled to an output manifold 606B. In operation, cool liquid enters the cooling pipes through the input manifold 606A, and heated liquid leaves the cooling pipes through the output manifold 606B.

Figure 7:
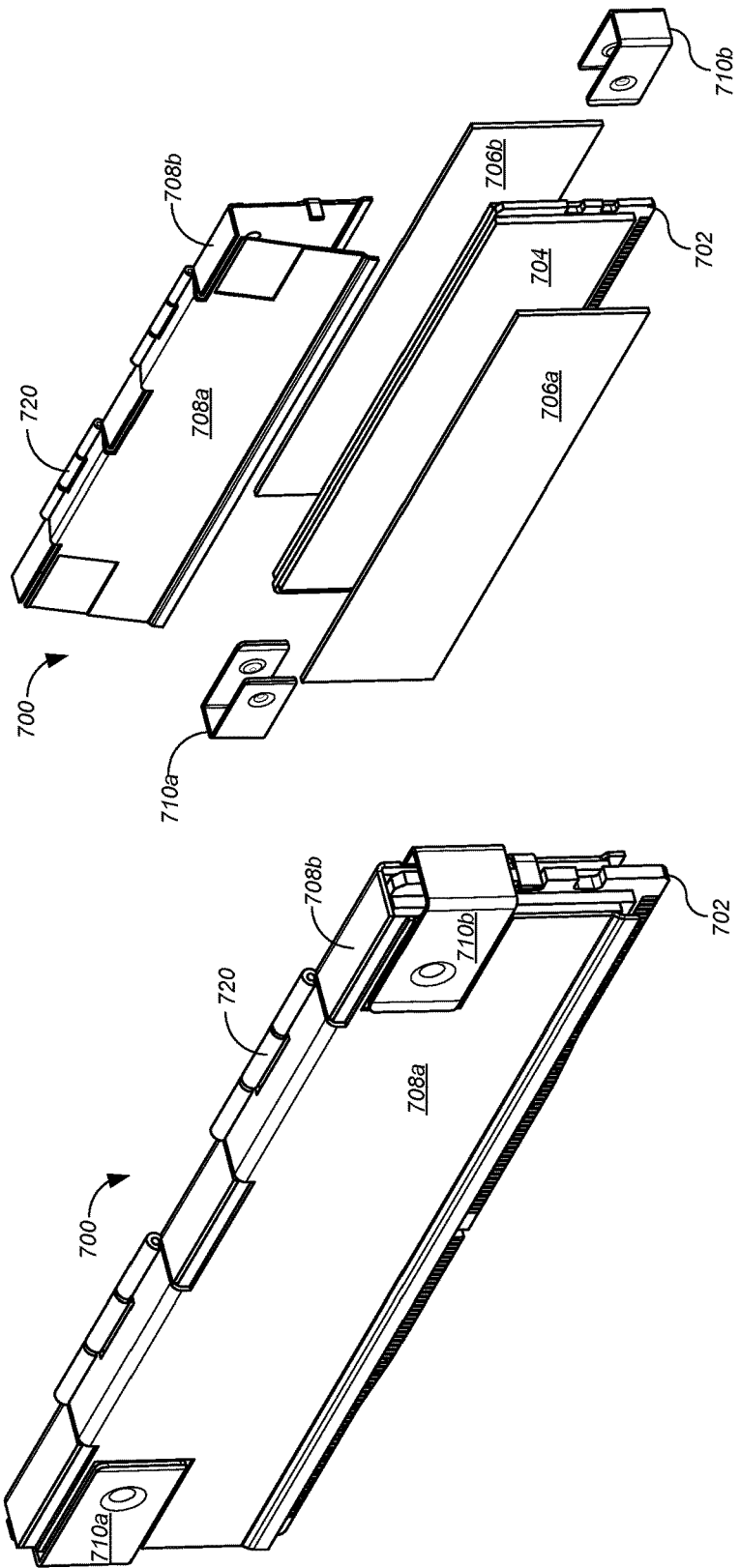
FIGS. 7A and 7B show a DIMM package featuring an external hinge according to one embodiment.

FIGS. 7A and 7B show a DIMM package featuring an external hinge according to one embodiment. FIG. 7B shows an exploded view, while FIG. 7A shows an assembled view. The DIMM package 700 includes a printed circuit board 702 upon which are mounted one or more integrated circuits, shown generally at 704. The printed circuit board 702 is generally double-sided, with integrated circuits 704 mounted upon both sides.

Layers of thermal interface material 706 are thermally coupled to the integrated circuits 704. One common thermal interface material is a thermal gap pad. However, other thermal interface materials may be used.

In the depicted embodiment, a removable heat spreader constituting a pair of side plates 708*a,b* joined by an external hinge 720 is brought into physical contact with the layers of thermal interface material 706*a,b*, and is thereby thermally coupled to the thermal interface material 706*a,b*. The side plates 708*a,b* may be made of aluminum. However, other materials may be used to form the side plates 708*a,b*.

One or more removable spring clips 710*a,b* may be positioned about the side plates 708 to press them against the thermal interface material 706 to ensure proper thermal coupling.

Figure 8:
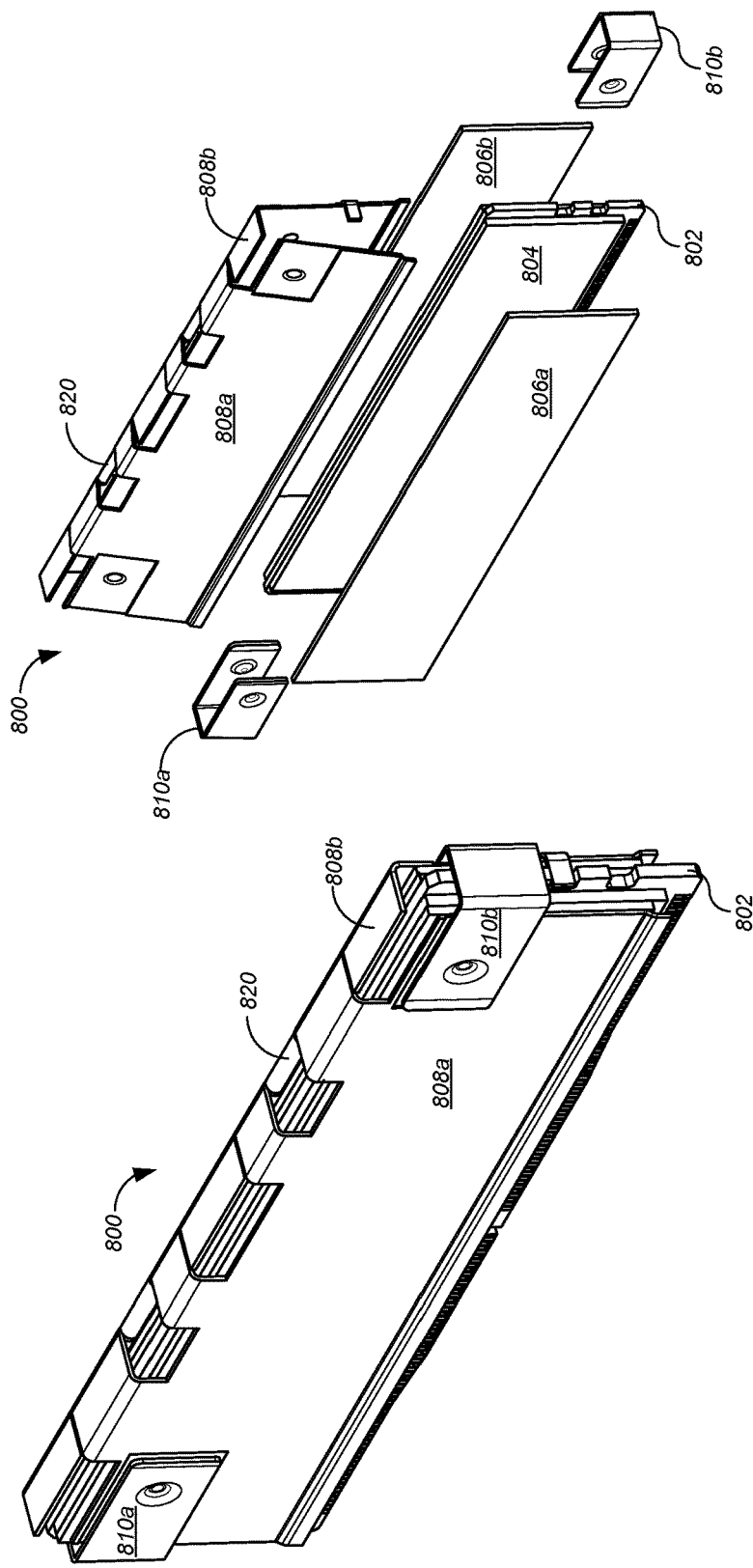
FIGS. 8A and 8B show a DIMM package featuring an internal hinge according to one embodiment.

FIGS. 8A and 8B show a DIMM package featuring an internal hinge according to one embodiment. FIG. 8B shows an exploded view, while FIG. 8A shows an assembled view. The DIMM package 800 includes a printed circuit board 802 upon which are mounted one or more integrated circuits, shown generally at 804. The printed circuit board 802 is generally double-sided, with integrated circuits 804 mounted upon both sides.

Layers of thermal interface material 806 are thermally coupled to the integrated circuits 804. One common thermal interface material is a thermal gap pad. However, other thermal interface materials may be used.

In the depicted embodiment, a removable heat spreader constituting a pair of side plates 808 joined by an internal hinge 820 is brought into physical contact with the layers of thermal interface material 806, and is thereby thermally coupled to the thermal interface material 806. The side plates 808 may be made of aluminum. However, other materials may be used to form the side plates 808.

One or more removable spring clips 810 may be positioned about the side plates 808 to press them against the thermal interface material 806 to ensure proper thermal coupling.

Figure 9:
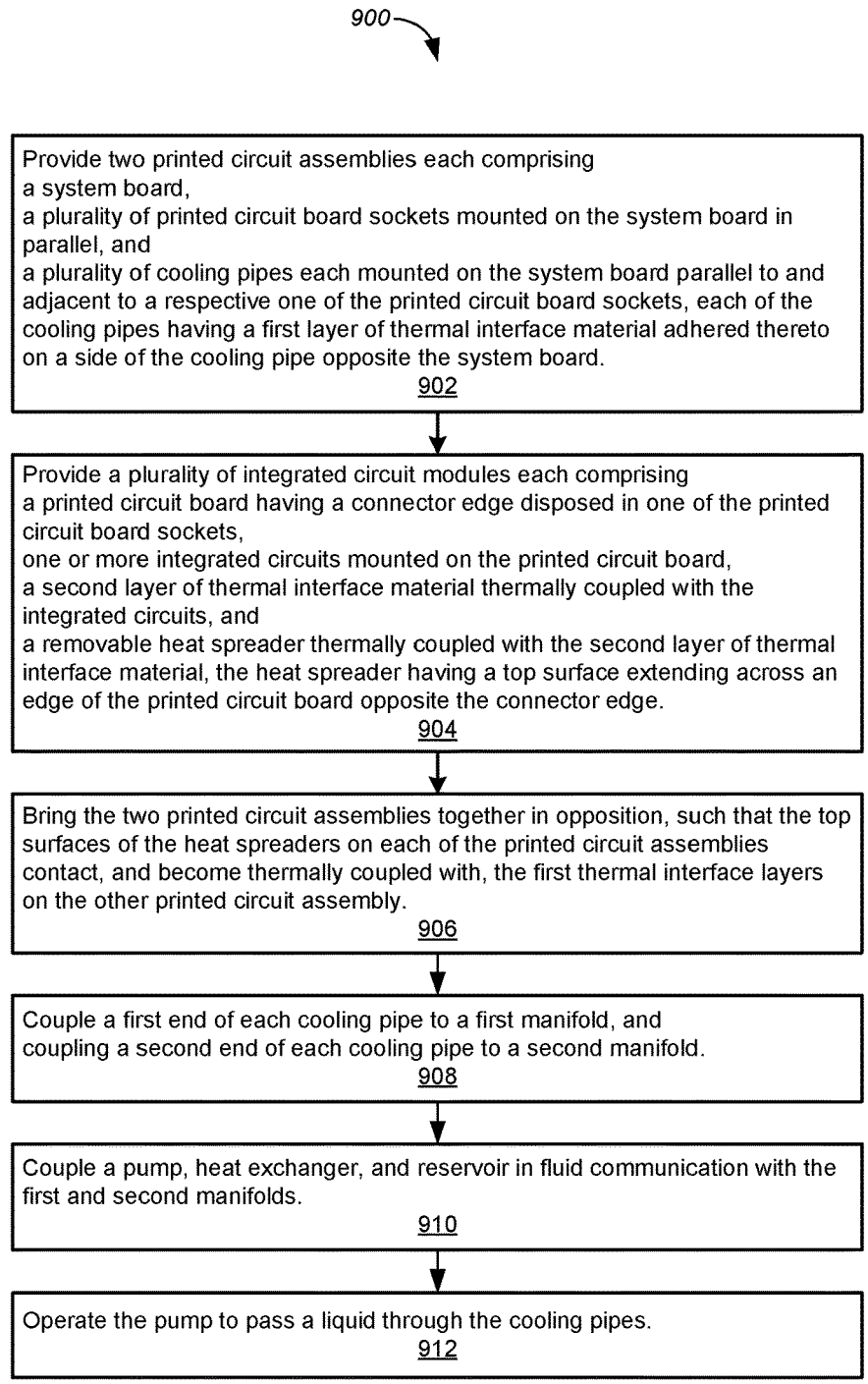
FIG. 9 shows a process according to one embodiment.

FIG. 9 shows a process 900 according to one embodiment. Although the steps of the process are shown in a particular sequence, some or all of the steps may be performed in other sequences, in parallel, or combinations thereof. Some of the steps may be omitted. Referring to FIG. 9, two printed circuit assemblies 400 are provided, at 902. Each printed circuit assembly 400 includes a system board 402, plurality of printed circuit board sockets 404 mounted on the system board 402 in parallel, a plurality of cooling pipes 406 each mounted on the system board 402 parallel to and adjacent to a respective one of the printed circuit board sockets 404, each of the cooling pipes 406 having a first layer of thermal interface material 408 adhered thereto on a side of the cooling pipe 406 opposite the system board 402.

The process 900 includes providing a plurality of integrated circuit modules, at 904. For example, the integrated circuit modules may include one or more DIMM packages 200. Each integrated circuit module includes a printed circuit board 202 having a connector edge 304 disposed in one of the printed circuit board sockets 404, one or more integrated circuits 204 mounted on the printed circuit board 202, a second layer of thermal interface material 206 thermally coupled with the integrated circuits 204, and a removable heat spreader 208 thermally coupled with the second layer of thermal interface material 206, the heat spreader 208 having a top surface 302 extending across an edge of the printed circuit board 202 opposite the connector edge 304.

The two printed circuit assemblies are brought together in opposition, at 906, such that the top surfaces 302 of the heat spreaders 208 on each of the printed circuit assemblies 400 contact, and become thermally coupled with, the first thermal interface material layers 408 on the other printed circuit assembly 400.

The process 900 includes coupling a first end of each cooling pipe 406 to a first manifold 606A, and coupling a second end of each cooling pipe 406 to a second manifold 606B, at 908.

The process 900 includes coupling a pump 110, heat exchanger 112, and reservoir 114 in fluid communication with the first and second manifolds 606A,B, at 910.

The process 900 includes operating the pump 110 to pass a liquid through the cooling pipes 406.

As used herein, the term "or" may be construed in either an inclusive or exclusive sense. Moreover, the description of resources, operations, or structures in the singular shall not be read to exclude the plural. Conditional language, such as, among others, "can," "could," "might," or "may," unless specifically stated otherwise, or otherwise understood within the context as used, is generally intended to convey that certain embodiments include, while other embodiments do not include, certain features, elements and/or steps.

Terms and phrases used in this document, and variations thereof, unless otherwise expressly stated, should be construed as open ended as opposed to limiting. Adjectives such as "conventional," "traditional," "normal," "standard," "known," and terms of similar meaning should not be construed as limiting the item described to a given time period or to an item available as of a given time, but instead should be read to encompass conventional, traditional, normal, or standard technologies that may be available or known now or at any time in the future. The presence of broadening words and phrases such as "one or more," "at least," "but not limited to" or other like phrases in some instances shall not be read to mean that the narrower case is intended or required in instances where such broadening phrases may be absent.

What is claimed is:

1. A liquid-cooled integrated circuit system comprising:
two printed circuit assemblies each comprising
a system board,
a plurality of printed circuit board sockets mounted on the system board in parallel, and
a plurality of cooling pipes each mounted on the system board parallel to and adjacent to a respective one of the printed circuit board sockets, each of the cooling pipes having a first layer of thermal interface material adhered thereto on a side of the cooling pipe opposite the system board; and
a plurality of integrated circuit modules each comprising
a printed circuit board having a connector edge disposed in one of the printed circuit board sockets,
one or more integrated circuits mounted on the printed circuit board,
a second layer of thermal interface material thermally coupled with the integrated circuits, and
a removable heat spreader thermally coupled with the second layer of thermal interface material, the heat spreader having a top surface extending across an edge of the printed circuit board opposite the connector edge;
wherein the two printed circuit assemblies are placed together in opposition such that the top surfaces of the heat spreaders on each of the printed circuit assemblies contact, and become thermally coupled with, the first thermal interface material layers on the other printed circuit assembly.

2. The liquid-cooled integrated circuit system of claim 1, further comprising:
a first manifold coupled to a first end of each cooling pipe; and
a second manifold coupled to a second end of each cooling pipe.

3. The liquid-cooled integrated circuit system of claim 1, further comprising:
a removable spring clip positioned about the heat spreader, wherein the removable spring clip presses the heat spreader against the second layer of thermal interface material when positioned about the heat spreader.

4. The liquid-cooled integrated circuit system of claim 1, wherein the heat spreader comprises:
two side plates thermally coupled with the second layer of thermal interface material;
wherein at least one of the side plates defines the top surface of the heat spreader.

5. The liquid-cooled integrated circuit system of claim 4, wherein the heat spreader further comprises:
an external hinge pivotably joining the two side plates.

6. The liquid-cooled integrated circuit system of claim 4, wherein the heat spreader further comprises:
an internal hinge pivotably joining the two side plates.

7. An apparatus comprising:
two printed circuit assemblies, each comprising:
a system board,
a plurality of printed circuit board sockets on the system board,
a plurality of liquid cooling pipes each coupled to the system board adjacent to one of the memory module sockets,
a plurality of integrated circuit modules connected to the printed circuit board sockets, and
a plurality of heat spreaders, each thermally coupled with one of the integrated circuit modules;
wherein the printed circuit assemblies are arranged opposite one another such that the integrated circuit modules of the two printed circuit assemblies are interleaved with one another and top surfaces of the heat spreaders of each of the printed circuit assemblies are thermally coupled with the liquid cooling pipes of the other printed circuit assembly.

8. The apparatus of claim 7, further comprising:
a first manifold coupled to a first end of each liquid cooling pipe; and
a second manifold coupled to a second end of each liquid cooling pipe.

9. The apparatus of claim 8, further comprising:
a cooling loop comprising
a pump in fluid communication with the first and second manifolds,
a heat exchanger in fluid communication with the first and second manifolds, and
a reservoir in fluid communication with the first and second manifolds.

10. The apparatus of claim 7, further comprising:
a removable spring clip positioned about each heat spreader.

11. The apparatus of claim 7, wherein each heat spreader comprises:
two side plates, wherein at least one of the side plates defines the top surface of the heat spreader.

12. The apparatus of claim 11, wherein the heat spreader further comprises:
an external hinge pivotably joining the two side plates.

13. The apparatus of claim 11, wherein the heat spreader further comprises:
an internal hinge pivotably joining the two side plates.

14. A method comprising:
providing two printed circuit assemblies, each comprising:
a system board,
a plurality of printed circuit board sockets on the system board,
a plurality of liquid cooling pipes each coupled to the system board adjacent to one of the memory module sockets,
a plurality of integrated circuit modules connected to the printed circuit board sockets, and
a plurality of heat spreaders, each thermally coupled with one of the integrated circuit modules; and
arranging the printed circuit assemblies opposite one another such that the integrated circuit modules of the two printed circuit assemblies are interleaved with one another and top surfaces of the heat spreaders of each of the printed circuit assemblies are thermally coupled with the liquid cooling pipes of the other printed circuit assembly.

15. The method of claim 14, further comprising:
passing a liquid through the liquid cooling pipes.

16. The method of claim 15, further comprising:
coupling a first end of each liquid cooling pipe to a first manifold;
coupling a second end of each liquid cooling pipe to a second manifold; and passing the liquid through the manifolds and the liquid cooling pipes.

17. The method of claim 14, further comprising:
for each of the integrated circuit modules, placing a removable spring clip about the heat spreader.

18. The method of claim 14, wherein the heat spreader comprises:
two side plates, wherein at least one of the side plates defines the top surface of the heat spreader.

19. The method of claim 18, wherein the heat spreader further comprises: an external hinge pivotably joining the two side plates.

20. The method of claim 18, wherein the heat spreader further comprises: an internal hinge pivotably joining the two side plates.

\* \* \* \* \*